(12) United States Patent
Komatsu et al.

(10) Patent No.: US 12,224,249 B2
(45) Date of Patent: Feb. 11, 2025

(54) PACKAGE MODULE COMPRISING MARKING AND SHIELD FILMS AND METHOD OF MANUFACTURING THE SAME

(71) Applicant: Murata Manufacturing Co., Ltd., Nagaokakyo (JP)

(72) Inventors: Toru Komatsu, Nagaokakyo (JP); Tadashi Nomura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 492 days.

(21) Appl. No.: 17/497,132

(22) Filed: Oct. 8, 2021

(65) Prior Publication Data

US 2022/0028799 A1    Jan. 27, 2022

Related U.S. Application Data

(63) Continuation of application No. PCT/JP2020/017145, filed on Apr. 21, 2020.

(30) Foreign Application Priority Data

Apr. 26, 2019    (JP) .................. 2019-086251

(51) Int. Cl.
| | | |
|---|---|---|
| *H01L 23/552* | (2006.01) | |
| *H01L 21/56* | (2006.01) | |
| *H01L 23/544* | (2006.01) | |
| *H01L 25/16* | (2023.01) | |

(52) U.S. Cl.
CPC .......... *H01L 23/552* (2013.01); *H01L 21/561* (2013.01); *H01L 23/544* (2013.01); *H01L 25/16* (2013.01)

(58) Field of Classification Search
CPC ... H01L 23/552; H01L 21/561; H01L 23/544; H01L 25/16; H01L 23/295
USPC ........................................................ 257/659
See application file for complete search history.

(56) References Cited

U.S. PATENT DOCUMENTS

| | | | |
|---|---|---|---|
| 2011/0006106 A1* | 1/2011 | Kanryo | ................. H01L 25/165 228/170 |
| 2011/0198115 A1* | 8/2011 | Azuma | ............... H01L 23/3135 29/840 |
| 2012/0295668 A1 | 11/2012 | Kitahara et al. | |

(Continued)

FOREIGN PATENT DOCUMENTS

| | | |
|---|---|---|
| JP | 2011233648 A | 11/2011 |
| JP | 2012243895 A | 12/2012 |
| JP | 2014209544 A | 11/2014 |

OTHER PUBLICATIONS

Written Opinion of the International Searching Authority issued for PCT/JP2020/017145, date of mailing Jun. 23, 2020.

(Continued)

*Primary Examiner* — Didarul A Mazumder
(74) *Attorney, Agent, or Firm* — ArentFox Schiff LLP

(57) ABSTRACT

A module is disclosed that includes a substrate having a first main surface, a first component mounted on the first main surface, a first sealing resin disposed so as to cover the first main surface and the first component, a marking film covering at least an upper surface of the first sealing resin, and a shield film covering the marking film. An upper surface of the marking film is locally formed with a first recess.

20 Claims, 10 Drawing Sheets

(56) References Cited

U.S. PATENT DOCUMENTS

| | | | |
|---|---|---|---|
| 2014/0204550 A1* | 7/2014 | Kataoka | H05K 3/284 |
| | | | 361/765 |
| 2014/0284775 A1 | 9/2014 | Nomura | |
| 2016/0005696 A1* | 1/2016 | Tomohiro | H01L 25/18 |
| | | | 257/777 |
| 2017/0358540 A1* | 12/2017 | Min | H01L 23/295 |
| 2018/0108618 A1 | 4/2018 | Yamamoto et al. | |

OTHER PUBLICATIONS

Written Opinion of the International Searching Authority issued for PCT/JP2020/017146, date of mailing Jun. 23, 2020.
International Search Report issued for PCT/JP2020/017145, date of mailing Jun. 23, 2020.
International Search Report issued for PCT/JP2020/017146, date of mailing Jun. 23, 2020.

* cited by examiner

PACKAGE MODULE COMPRISING MARKING AND SHIELD FILMS AND METHOD OF MANUFACTURING THE SAME

CROSS REFERENCE TO RELATED APPLICATIONS

The present application is a continuation of PCT/JP2020/017145 filed Apr. 21, 2020, which claims priority to Japanese Patent Application No. 2019-086251, filed Apr. 26, 2019, the entire contents of each of which are incorporated herein by reference.

TECHNICAL FIELD

The present invention relates to a module and a method of manufacturing the same.

BACKGROUND

Japanese Patent Laid-Open No. 2012-243895 (hereinafter "PTL 1") describes a power amplification module. The power amplification module described in PTL 1 includes a wiring board which is formed with a multilayer wiring layer therein, and a semiconductor chip and a passive component which are mounted on the wiring board. A sealing body is formed on the wiring board so as to cover the semiconductor chip, the wire, and the passive component. A plurality of recesses are formed on the surface of the sealing body as a product identification mark and a peeling prevention mark. The surface of the sealing body on which the product identifying mark and the peeling prevention mark are formed is covered with a shield film.

In PTL 1, after the sealing body is formed, the product identification mark and the peeling prevention mark are formed on the surface of the sealing body by irradiating the surface of the sealing body with a laser beam.

In order to make the product identification mark visible, the recess which is formed as the product identification mark must be processed to a certain depth. To this end, a resin layer which is formed as the sealing body must have a thickness sufficiently larger than the depth of the recess to be formed by laser irradiation. Otherwise, the laser irradiation performed on the sealing body may damage the wiring substrate or components mounted on the wiring substrate.

When the thickness of the sealing body is not sufficient, it is necessary to print the product identification mark by laser irradiation while avoiding the components mounted on the wiring substrate. In other words, a mark may not be printed at a position where a component is mounted. When a mark is printed under such a restriction, information that may be printed in the mark and the size thereof are limited.

SUMMARY OF THE INVENTION

Therefore, the present invention provides a module constructed to prevent a component mounted thereon from being affected by the printing of a mark and to prevent the layout of the mark from being restricted by the arrangement of the component mounted thereon, Moreover, a method of manufacturing such a module is also described herein.

Accordingly, a module according to an exemplary embodiment includes a substrate having a first main surface, a first component mounted on the first main surface, a first sealing resin disposed so as to cover the first main surface and the first component, a marking film covering at least an upper surface of the first sealing resin, and a shield film covering the marking film. Moreover, an upper surface of the marking film is locally formed with a first recess.

According to the exemplary embodiment of the present invention, since the marking film is provided and the first recess is formed as a recess on the upper surface of the marking film, the module is constructed to prevent a component mounted thereon from being affected by the printing of a mark and to also prevent the layout of the mark from being restricted by the arrangement of the component mounted thereon.

DETAILED DESCRIPTION OF EMBODIMENTS

Figure 1:
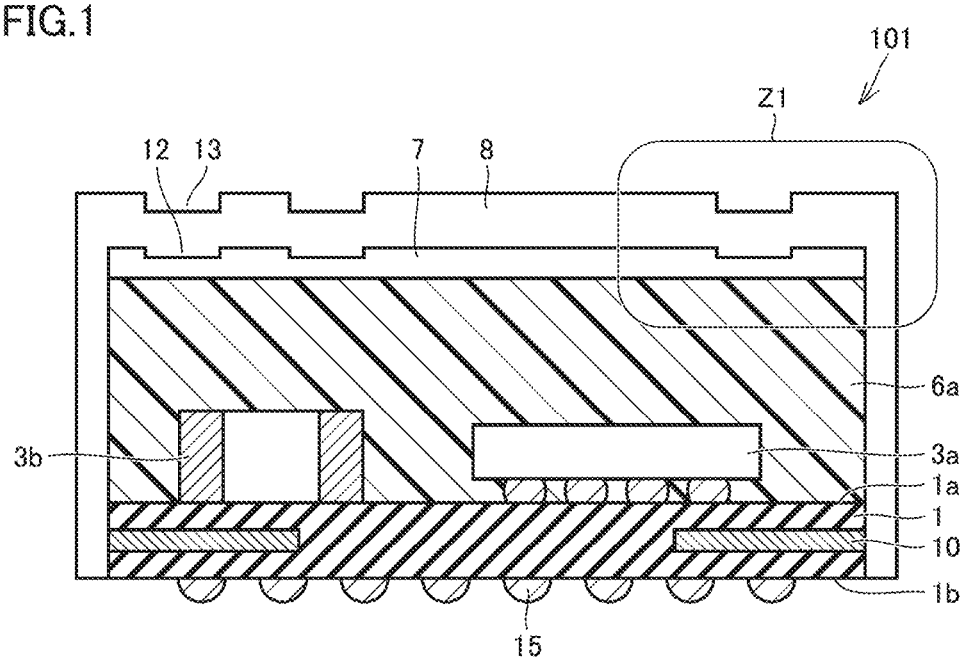
FIG. 1 is a cross-sectional view illustrating a module according to a first exemplary embodiment.

It is generally noted that components in the drawings may not be drawn to scale, and may be exaggerated for the convenience of explanation. In the following description, when an upper position or a lower position is mentioned, it does not necessarily mean an absolutely upper or lower position, and it may mean a relatively upper or lower position in the illustrated pose.

First Exemplary Embodiment

A module according to a first exemplary embodiment will be described with reference to FIGS. 1 to 2. FIG. 1 is a cross-sectional view illustrating a module 101 according to the present embodiment.

As shown, the module 101 includes a substrate 1 having a first main surface 1*a*, a first component 3*a* mounted on the first main surface 1*a*, a first sealing resin 6*a* disposed so as to cover the first main surface 1*a* and the first component 3*a*, a marking film 7 covering at least an upper surface of the first sealing resin 6a, and a shield film 8 covering the marking film 7. An upper surface of the marking film 7 is locally formed with a first recess 12. The upper surface of the shield film 8 is preferably formed with a second recess 13 corresponding to the first recess 12.

In an exemplary aspect, the substrate 1 is a wiring substrate. A GND electrode 10 is formed by a conductor pattern inside the substrate 1. The GND electrode 10 is exposed from a side surface of the substrate 1. In addition to the first component 3a, a component 3b is mounted on the first main surface 1a of the substrate 1. The first component 3a may be, for example, an integrated circuit (IC). The component 3b may be, for example, an inductor, a capacitor or the like. The first sealing resin 6a is formed so as to cover all the components mounted on the first main surface 1a.

The substrate 1 has a second main surface 1b opposite to the first main surface 1a. The second main surface 1b is provided with external terminals 15. The external terminals 15 are solder balls, for example.

Figure 2:
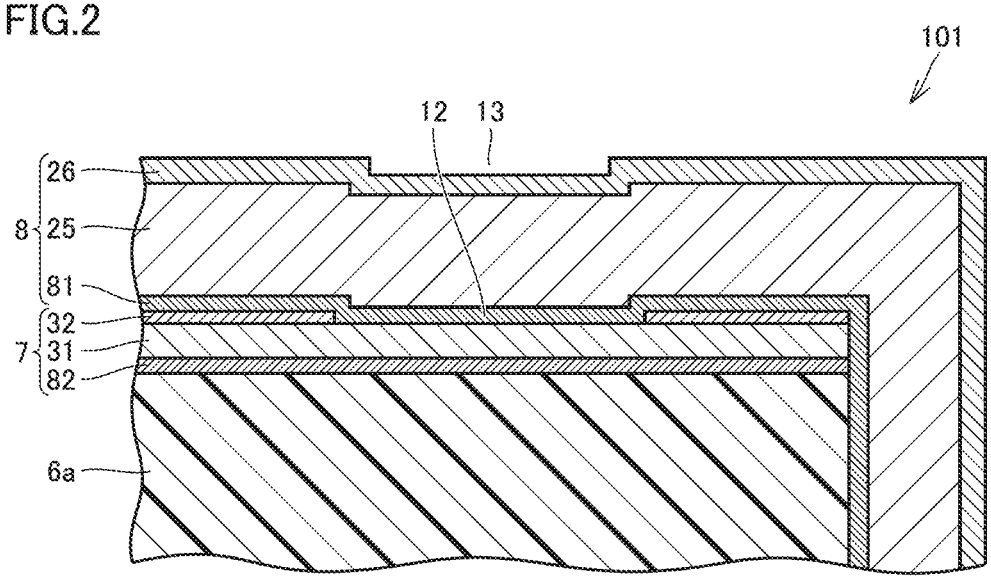
FIG. 2 is a partially enlarged view illustrating a portion Z1 in FIG. 1.

FIG. 2 is an enlarged view illustrating a portion Z1 in FIG. 1. As shown, the shield film 8 includes a conductive layer 25 and a protective layer covering the conductive layer 25. In the example illustrated in the drawings, the protective layer is preferably a rustproof layer 26. Moreover, the conductive layer 25 is preferably formed of a material having high conductivity, such as Cu, for example. The rustproof layer 26 may be formed of, for example, Ni, Cr, Ti, or an alloy of two or more metals selected from Ni, Cr and Ti. The alloy may be, for example, stainless steel (SUS).

The marking film 7 includes a first layer 31 and a second layer 32 covering the first layer 31. The first recess 12 is formed by locally removing the second layer 32 so as to expose the first layer 31. The first layer 31 is formed of a material which is hard to be removed by laser irradiation, and the second layer 32 is formed of a material which is easy to be removed by laser irradiation. That is, the second layer 32 is formed from a material easier to be removed by laser irradiation than the first layer 31.

The shield film 8 includes a first adhesion layer 81. In exemplary aspects, the thickness of the first adhesion layer 81 may be, for example, about 50 nm. The thickness of the conductive layer 25 may be, for example, 6 μm. The thickness of the rustproof layer 26 may be, for example, 2 μm.

The marking film 7 includes a second adhesion layer 82. In exemplary aspects, the thickness of the second adhesion layer 82 may be, for example, about 50 nm. The thickness of the first layer 31 may be, for example, 6 μm. The thickness of the second layer 32 may be, for example, 2 μm. The thickness of the marking film 7 may be the same as or different from the thickness of the shield film 8.

In the present embodiment, the upper surface of the marking film 7 is locally formed with a first recess 12, and the upper surface of the shield film 8 is formed with a second recess 13 corresponding to the first recess 12. In the exemplary aspect, the type or the like of the module 101 can be identified by visually recognizing the second recess 13 that is configured as a mark. Advantageously, this mark may be formed without removing the first sealing resin 6a. Therefore, the components sealed by the first sealing resin 6a will not be affected. According to the present embodiment, the module is constructed to prevent the components mounted thereon from being affected by the printing of a mark and to prevent the layout of the mark from being restricted by the arrangement of the components mounted thereon.

As illustrated in the present embodiment, the marking film 7 preferably includes the first layer 31 and the second layer 32 covering the first layer 31, and the first recess 12 preferably is formed by locally removing the second layer 32 so as to expose the first layer 31. Thus, it is possible to easily perform the step of forming the first recess 12, and it is possible to prevent any component under the marking layer 7 from being affected by laser irradiation.

The first layer 31 is preferably formed of the same material as the conductive layer 25, and the second layer 32 is preferably formed of the same material as the protective layer. Thus, the marking film 7 and the shield film 8 can be formed by using the same or similar manufacturing equipment, which is efficient. For example, a three-layer structure with the same combination may be repeatedly formed twice, and the lower three-layer structure may be used as the marking film 7, and the upper three-layer structure may be used as the shield film 8.

As illustrated in the present embodiment, the marking film 7 preferably covers only the upper surface of the first sealing resin 6a. Thus, as to be described later, it is possible to employ such a manufacturing method that after a marking film 7 is formed on the collective substrate, the collective substrate is cut into individual products, which makes it possible to manufacture the products efficiently.

As illustrated in the present embodiment, the shield film 8 preferably covers the upper surface of the marking film 7, the side surface of the marking film 7, the side surface of the first sealing resin 6a, and the side surface of the substrate 1. Thus, the shielding may be performed more reliably.

As illustrated in the present embodiment, a surface of the shield film 8 closer to the marking film 7 is preferably formed with a first adhesion layer 81. Thus, the shield film 8 may be more strongly adhered to the marking film 7.

As illustrated in the present embodiment, a surface of the marking film 7 closer to the first sealing resin 6a is preferably formed with a second adhesion layer 82. Thus, the marking film 7 may be more strongly adhered to the first sealing resin 6a.

Second Exemplary Embodiment

Figure 3:
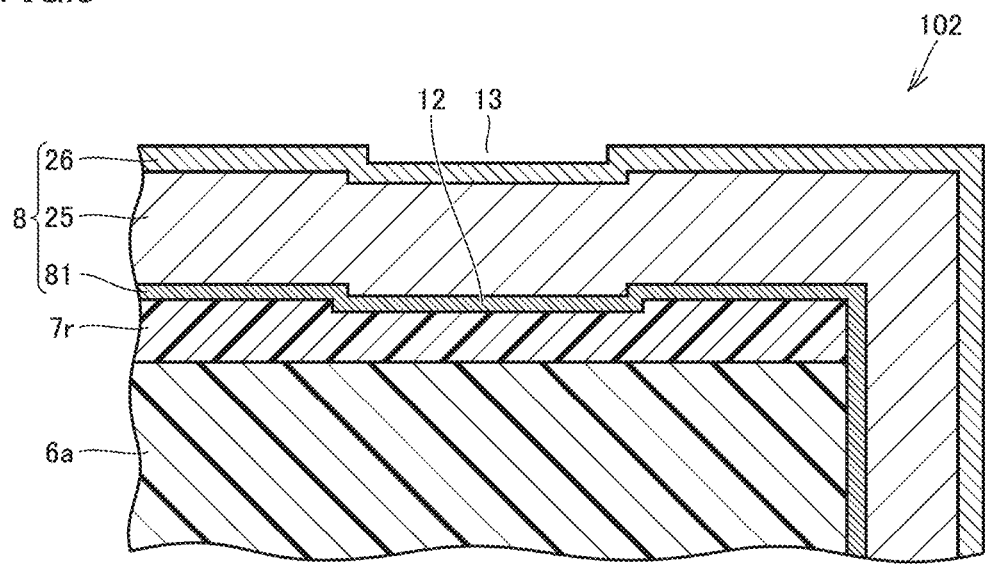
FIG. 3 is a partial cross-sectional view illustrating a module according to a second exemplary embodiment.

A module according to a second exemplary embodiment will be described with reference to FIG. 3. FIG. 3 is a partial cross-sectional view illustrating a module 102 according to the present embodiment.

As shown, the module 102 includes a substrate 1 having a first main surface 1a, a first component 3a mounted on the first main surface 1a, a first sealing resin 6a disposed so as to cover the first main surface 1a and the first component 3a, a marking film 7r covering at least an upper surface of the first sealing resin 6a, and a shield film 8 covering the marking film 7r. The upper surface of the marking film 7r is locally formed with a first recess 12 and the upper surface of the shield film 8 is formed with a second recess 13 corresponding to the first recess 12.

The marking film 7r is formed of a material that may be removed, but may not be penetrated by laser irradiation. The marking film 7r may or may not have conductivity and, for example, can be formed of a resin.

Also in the present embodiment, since a mark may be formed without removing the first sealing resin 6a, the same effect as that described in the first embodiment may be obtained.

Third Exemplary Embodiment

Figure 4:
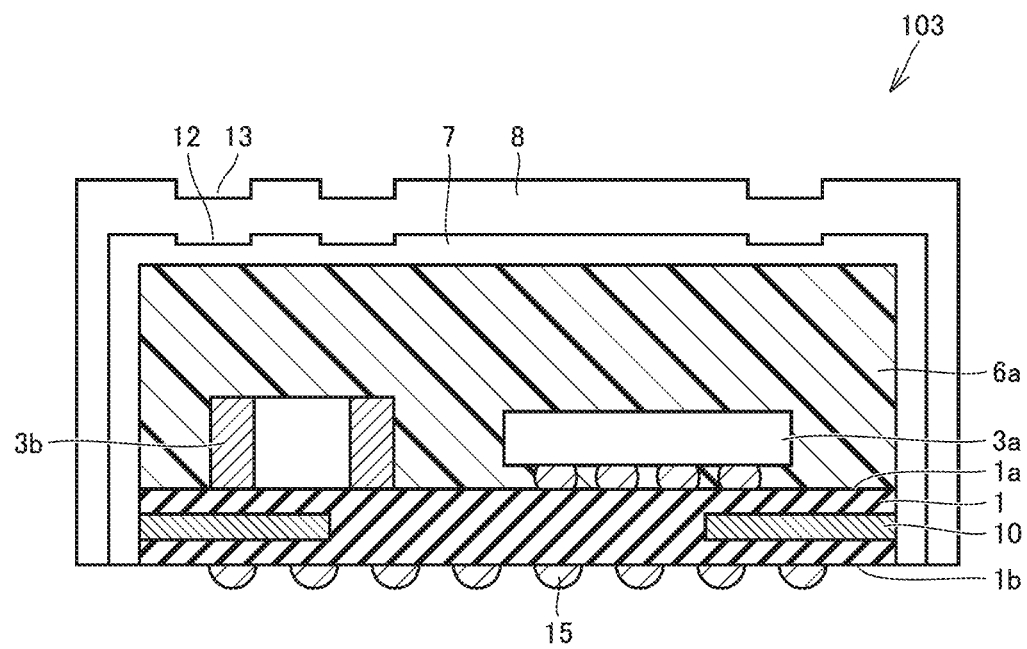
FIG. 4 is a cross-sectional view illustrating a module according to a third exemplary embodiment.

A module according to a third exemplary embodiment will be described with reference to FIG. 4. FIG. 4 is a cross-sectional view illustrating a module 103 according to the present embodiment.

In the module 103, the marking film 7 not only covers the upper surface of the first sealing resin 6a, but also covers the upper surface of the first sealing resin 6a, the side surface of the first sealing resin 6a, and the side surface of the substrate 1. Also in the present embodiment, the same effect as that described in the first embodiment may be obtained.

Fourth Exemplary Embodiment

Figure 5:
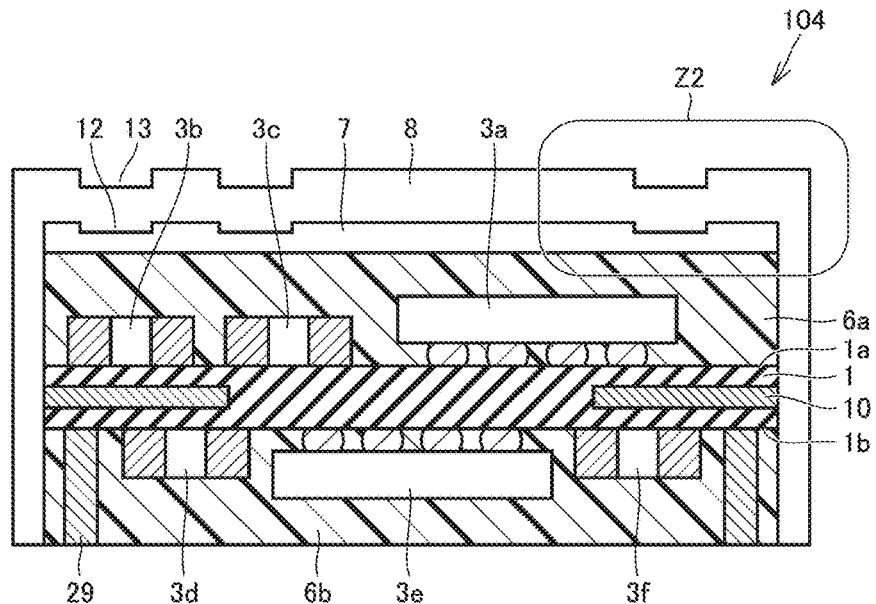
FIG. 5 is a cross-sectional view illustrating a module according to a fourth exemplary embodiment.

A module according to a fourth exemplary embodiment will be described with reference to FIG. 5. FIG. 5 is a cross-sectional view illustrating a module 104 according to the present embodiment.

As shown, the module 104 includes a substrate 1 having a first main surface 1a, a first component 3a mounted on the first main surface 1a, a first sealing resin 6a disposed so as to cover the first main surface 1a and the first component 3a, a marking film 7 covering at least an upper surface of the first sealing resin 6a, and a shield film 8 covering the marking film 7. The upper surface of the marking film 7r is locally formed with a first recess 12 and the upper surface of the shield film 8 is formed with a second recess 13 corresponding to the first recess 12. An enlarged view of a portion Z2 in FIG. 5 is the same as that illustrated in FIG. 2.

The substrate 1 has a second main surface 1b opposite to the first main surface 1a. A second component 3e is mounted on the second main surface 1b. A second sealing resin 6b is disposed so as to cover the second main surface 1b and the second component 3e. The shield film 8 covers the side surface of the second sealing resin 6b.

In addition to the first component 3a, components 3b and 3c are mounted on the first main surface 1a. Similar to the first component 3a, the components 3b and 3c are also sealed by the first sealing resin 6a. In addition to the second component 3e, components 3d and 3f are mounted on the second main surface 1b. A columnar conductor 29 is provided upright on the second main surface 1b. The columnar conductor 29 penetrates the second sealing resin 6b. The columnar conductor 29 is used as an external electrode of the module 104 after the module 104 is mounted on a mother substrate or the like. Again, in the present embodiment, the same effect as that described in the first embodiment may be obtained.

Fifth Exemplary Embodiment

Figure 6:
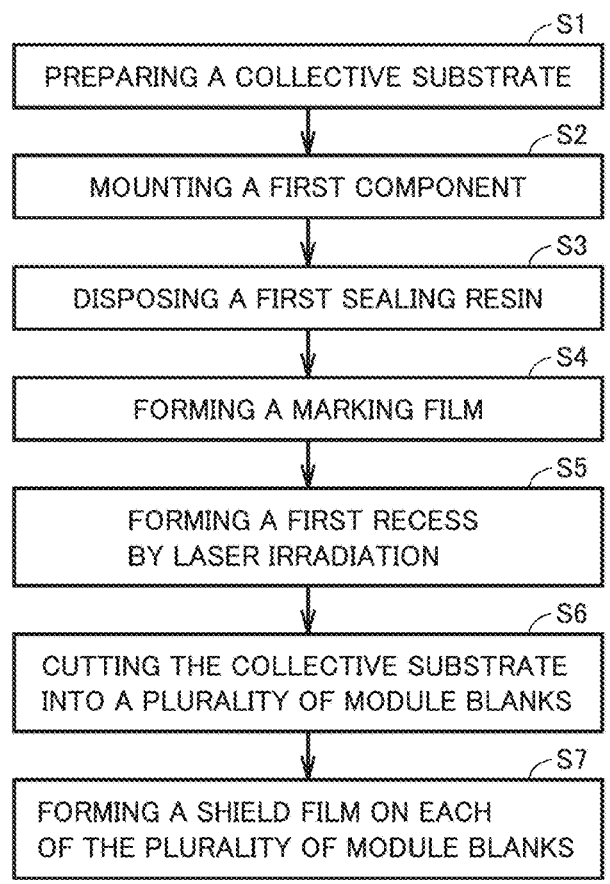
FIG. 6 is a flowchart illustrating a method of manufacturing a module according to a fifth exemplary embodiment.

A method of manufacturing a module according to a fifth exemplary embodiment will be described with reference to FIGS. 6 to 10. FIG. 6 is a flowchart illustrating the method of manufacturing a module according to the present embodiment.

The method of manufacturing a module according to the present embodiment includes a step S1 of preparing a collective substrate, a step S2 of mounting a first component on a first main surface of the collective substrate, a step S3 of disposing a first sealing resin so as to cover the first main surface and the first component, a step S4 of forming a marking film so as to cover an upper surface of the first sealing resin, a step S5 of forming a first recess by irradiating an upper surface of the marking film with a laser beam, a step S6 of cutting the collective substrate into a plurality of module blanks, and a step S7 of forming a shield film on each of the plurality of module blanks so as to cover an upper surface and a side surface thereof. Each step will be described below with reference to the drawings.

Figure 7:
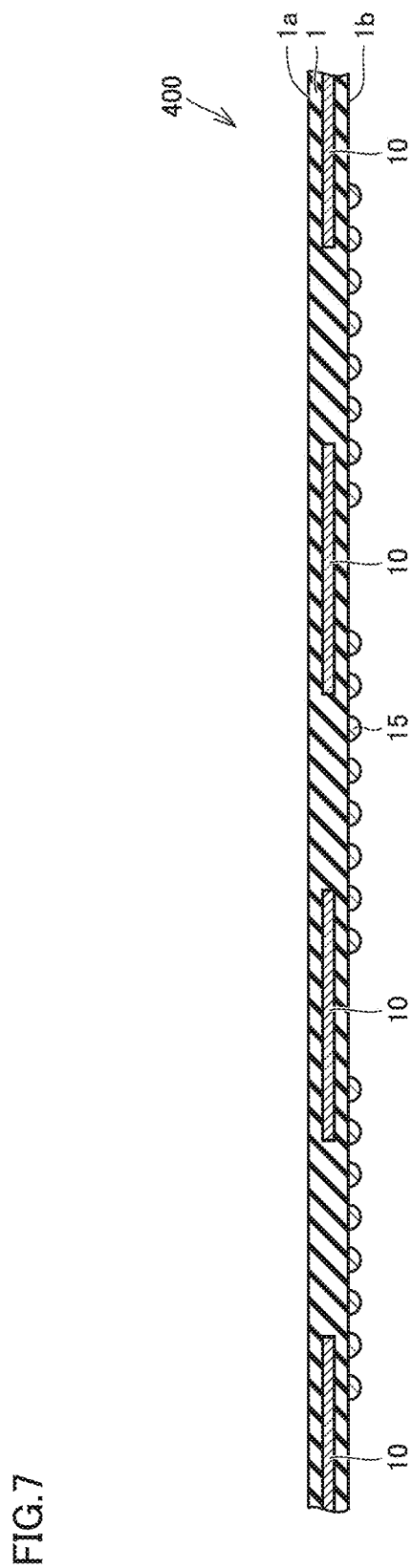
FIG. 7 is an explanatory view illustrating a first step in the method of manufacturing a module according to the fifth exemplary embodiment.
Figure 8:
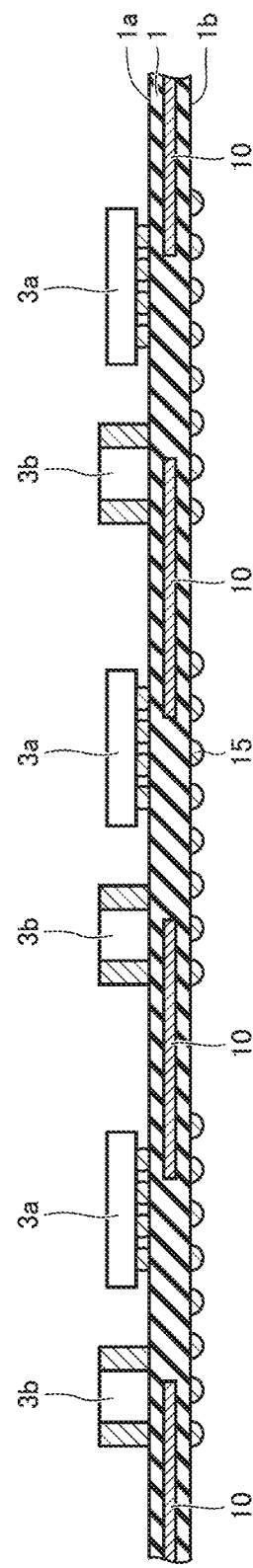
FIG. 8 is an explanatory view illustrating a second step in the method of manufacturing a module according to the fifth exemplary embodiment.
Figure 9:
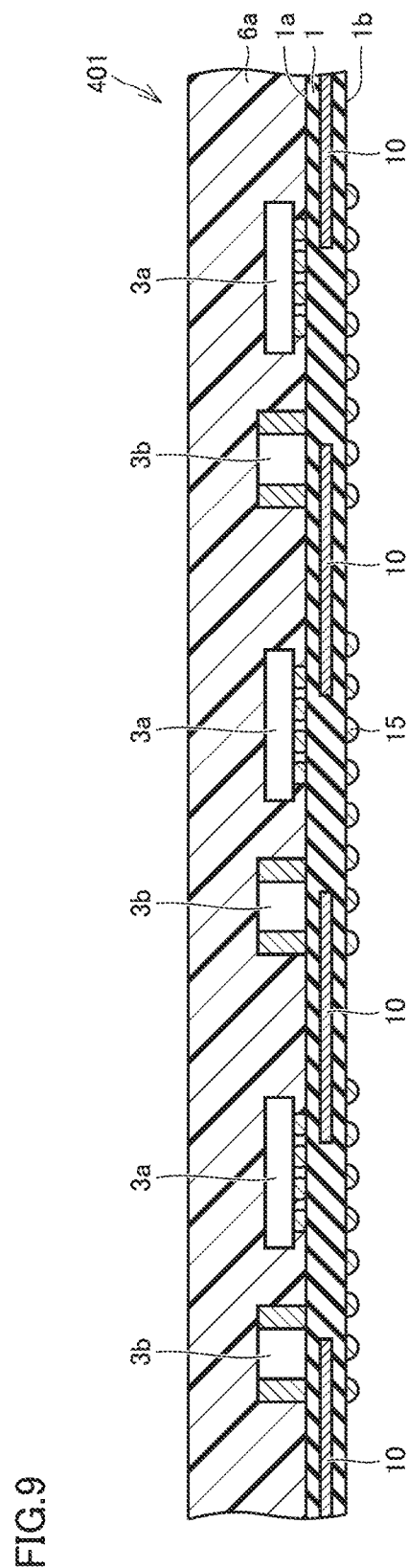
FIG. 9 is an explanatory view illustrating a third step in the method of manufacturing a module according to the fifth exemplary embodiment.

First, in step S1, as illustrated in FIG. 7, a collective substrate 400 is prepared. The collective substrate 400 includes a substrate 1. The substrate 1 has a first main surface 1a and a second main surface 1b. In step S2, as illustrated in FIG. 8, a first component 3a is mounted on the first main surface 1a of the collective substrate 400, and a component 3b is also mounted on the first main surface 1a. In step S3, as illustrated in FIG. 9, a first sealing resin 6a is disposed so as to cover the first main surface 1a and the first component 3a. Thus, a collective substrate 401 is obtained in which the upper surface of the first sealing resin 6a is exposed.

Figure 10:
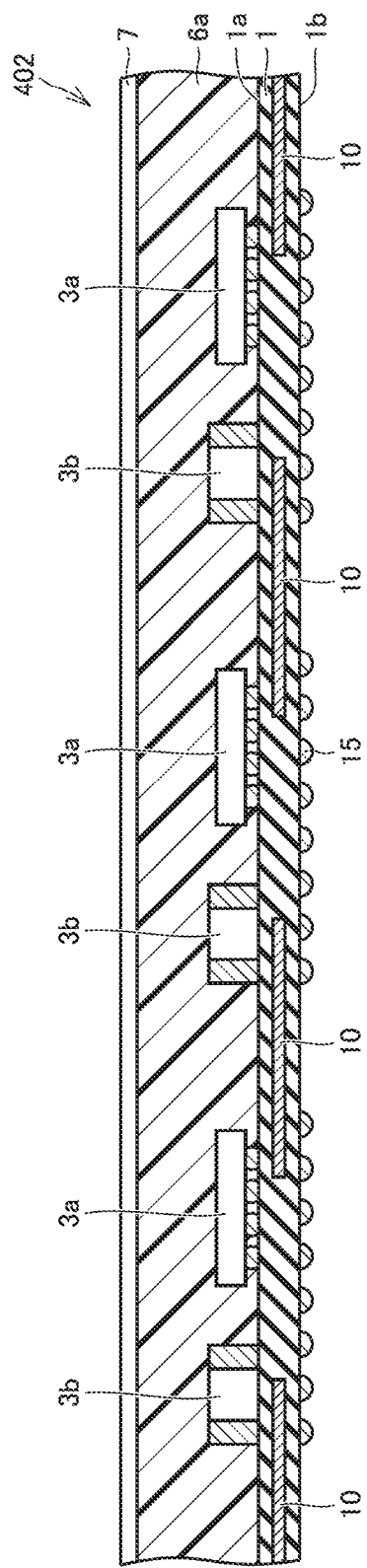
FIG. 10 is an explanatory view illustrating a fourth step in the method of manufacturing a module according to the fifth exemplary embodiment.

Next, in step S4, as illustrated in FIG. 10, a marking film 7 is formed so as to cover the upper surface of the first sealing resin 6a. Thus, a collective substrate 402 is obtained. The marking film 7 is the same as that described in detail in the first embodiment.

Figure 11:
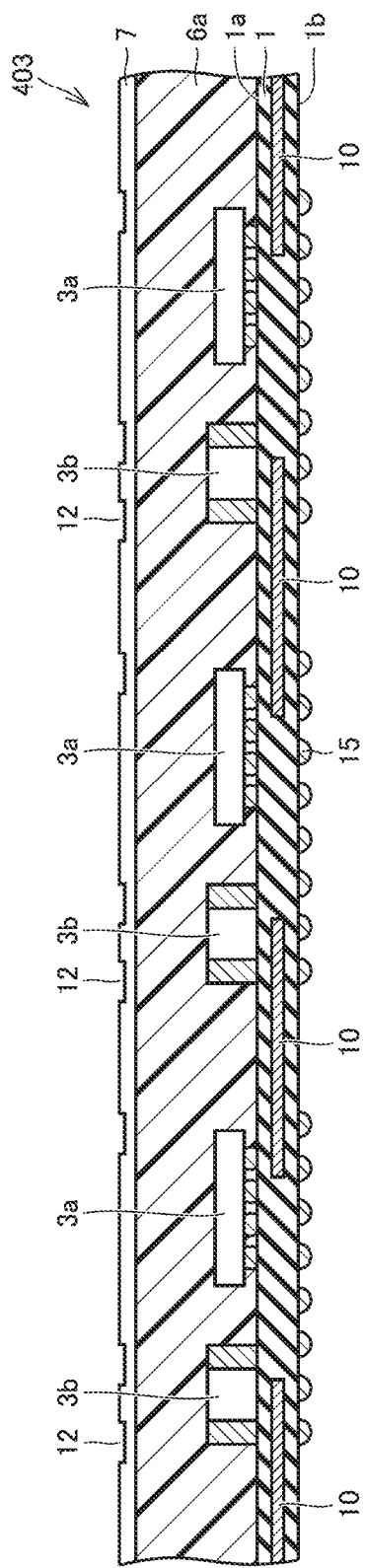
FIG. 11 is an explanatory view illustrating a fifth step in the method of manufacturing a module according to the fifth exemplary embodiment.

In step S5, as illustrated in FIG. 11, a first recess 12 is formed by laser irradiation. The first recess 12 is a cavity formed on the upper surface of the first sealing resin 6a. Thus, a collective substrate 403 is obtained.

Figure 12:
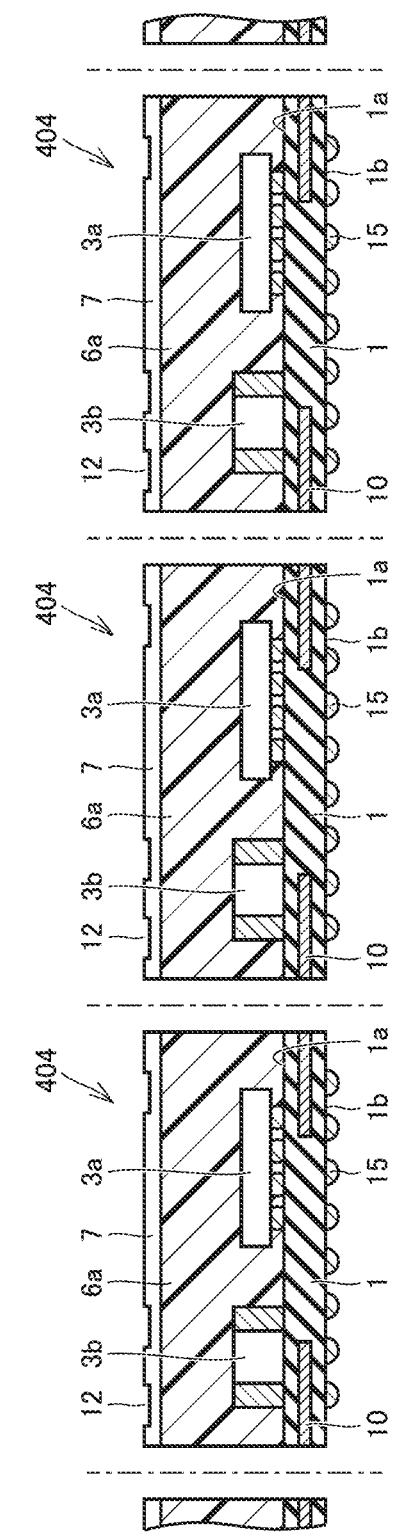
FIG. 12 is an explanatory view illustrating a sixth step in the method of manufacturing a module according to the fifth exemplary embodiment.

In step S6, as illustrated in FIG. 12, the collective substrate 403 is cut into a plurality of module blanks 404. In FIG. 12, the cutting line is indicated by a dashed line. The plurality of module blanks 404 may be cut by dicing or the like.

Figure 13:
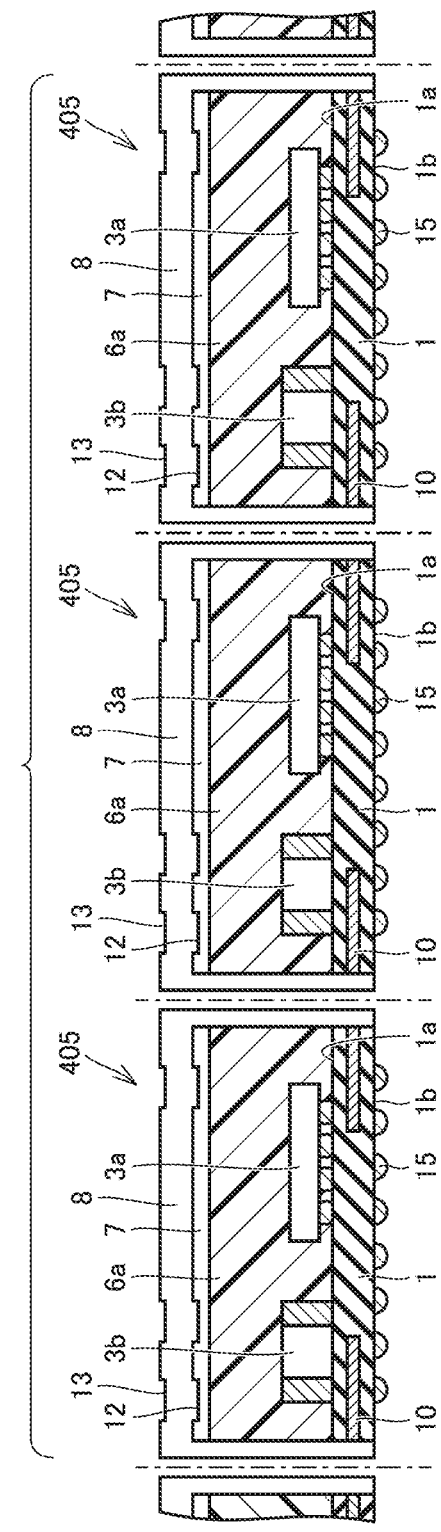
FIG. 13 is an explanatory view illustrating a seventh step in the method of manufacturing a module according to the fifth exemplary embodiment.

In step S7, as illustrated in FIG. 13, a shield film 8 is formed on each module blank 404. Thus, a plurality of modules 405 are obtained. The shield film 8 covers the upper surface of the marking film 7, the side surface of the marking film 7, the side surface of the first sealing resin 6a, and the side surface of the substrate 1. According to exemplary aspects, the shield film 8 can be formed by any film forming method such as sputtering, vapor deposition, plating, or the like after the second main surface 1b of each module blank 404 is masked. The recesses in the shield film 8 are formed to correspond to the recesses in the marking film 7 when the shield film 8 is formed on each module blank 404 since the recesses on the marking film 7 are already formed therein in step S5.

According to the present embodiment, a module is provided that is constructed to prevent a component mounted thereon from being affected by the printing of a mark and to prevent the layout of the mark from being restricted by the arrangement of the component mounted thereon.

The marking film 7 preferably includes a first layer and a second layer covering the first layer, and in the step S2 of forming the first recess 12, the first layer is preferably exposed by locally removing the second layer. It is noted that the reason therefore is the same as that described in the first embodiment.

Moreover, it is noted that the marking film 7 is not necessarily limited to a film including a combination of plural layers. The marking film 7 may be a single layer film. The marking film 7 may be any film as long as it may be formed with a recess by laser irradiation and may not be penetrated by the laser beam.

The step S2 of forming the first recess 12 is performed on the collective substrate 401. Thus, since the target by laser irradiation is the collective substrate, the first recess 12 can be formed simultaneously or sequentially on a plurality of module blanks, which makes it possible to perform step S2 efficiently.

Instead of performing the step S2 on the collective substrate 401, the step S2 of forming the first recess 12 can be performed on each individual module blank 402 after the step S3 of cutting the collective substrate 401 into a plurality of individual module blanks 402.

In general, it is noted that the embodiments described above may be appropriately combined. Moreover, the embodiments disclosed herein are illustrative and non-restrictive in all respects.

REFERENCE SIGNS LIST

1: substrate; 1a: first main surface; 1b: second main surface; 3a: first component; 3b, 3c, 3d, 3f: component; 3e: second component; 7, 7r: marking film; 8: shield film; 10: GND electrode; 12: first recess; 13: second recess; 15: external terminal; 25: conductive layer; 26: rustproof layer; 29: columnar conductor; 31: first layer; 32: second layer; 81: first adhesion layer; 82: second adhesion layer; 101, 102, 103, 104: module; 400, 401, 402, 403: collective substrate; 404: module blank; 405: module

The invention claimed is:

1. A module comprising:
a substrate having a first main surface;
a first component mounted on the first main surface;
a first sealing resin disposed to cover the first main surface and the first component;
a marking film covering at least an upper surface of the first sealing resin and having an upper surface opposite the first sealing resin that comprises a first recess locally disposed therein, and a lower surface adjacent to the upper surface of the first sealing resin that is a completely uniform surface; and
a shield film covering the marking film.

2. The module according to claim 1, wherein the shield film comprises an upper surface having a second recess that corresponds to the first recess.

3. The module according to claim 2, wherein the second recess of the shield film overlaps with the first recess of the first sealing resin relative to a direction normal to the first main surface of the substrate.

4. The module according to claim 1, wherein the shield film includes a conductive layer and a protective layer that covers the conductive layer.

5. The module according to claim 4, wherein the protective layer is a rustproof layer.

6. The module according to claim 4, wherein the marking film includes a first layer and a second layer that covers the first layer.

7. The module according to claim 6, wherein the first recess is disposed at a position in the second layer that is removed so as to expose the first layer.

8. The module according to claim 6, wherein the first layer comprises a same material as the conductive layer, and the second layer comprises a same material as the protective layer.

9. The module according to claim 1, wherein the marking film covers only the upper surface of the first sealing resin.

10. The module according to claim 1, wherein the shield film covers the upper surface of the marking film, a side surface of the marking film, a side surface of the first sealing resin, and a side surface of the substrate.

11. The module according to claim 1, wherein the shield film comprises a surface closer to the marking film that is configured by an adhesion layer.

12. The module according to claim 1, wherein the marking film comprises a surface closer to the first sealing resin that is configured with an adhesion layer.

13. The module according to claim 1,
wherein the substrate has a second main surface opposite to the first main surface,
wherein a second component is mounted on the second main surface,
wherein a second sealing resin covers the second main surface and the second component, and
wherein the shield film covers a side surface of the second sealing resin.

14. A module comprising:
a substrate having a main surface;
an electronic component mounted on the main surface of the substrate;
a sealing resin that covers the main surface of the substrate and the electronic component;
a marking film that covers the sealing resin opposite the substrate and that has a surface opposite the sealing resin that includes a first recess extending therein towards the sealing resin, and a lower surface adjacent to the surface of the sealing resin that is a completely uniform surface; and
a shield film that covers the marking film and includes a surface opposite the marking film with a second recess that aligns with the first recess of the marking film.

15. The module according to claim 14, wherein the second recess of the shield film overlaps with the first recess of the sealing resin relative to a direction normal to the main surface of the substrate.

16. A method of manufacturing a module, the method comprising:
preparing a collective substrate;
mounting a plurality of components on a first main surface of the collective substrate;
disposing a first sealing resin to cover the first main surface and the plurality of components;
forming a marking film to cover an upper surface of the first sealing resin;
forming a plurality of first recesses by irradiating an upper surface of the marking film with a laser beam;
cutting the collective substrate into a plurality of module blanks; and
forming a shield film on each of the plurality of module blanks to cover an upper surface and a side surface thereof.

17. The method of manufacturing a module according to claim 16,
wherein the marking film includes a first layer and a second layer that covers the first layer, and
wherein the forming of the plurality of first recesses comprises exposing the first layer by locally removing the second layer.

18. The method of manufacturing a module according to claim 16, wherein the forming of the plurality of first recesses is performed on the collective substrate.

19. The method of manufacturing a module according to claim 17, wherein the forming of the shield film includes forming a plurality of second recesses in an upper surface of the shield film that corresponds to the plurality of first recesses.

20. The method of manufacturing a module according to claim 19, wherein the plurality of second recesses of the shield film overlaps with the plurality of first recesses of the first sealing resin relative to a direction normal to the first main surface of the substrate.

* * * * *